United States Patent [19]

Mellissinos et al.

[11] Patent Number: 5,341,050
[45] Date of Patent: Aug. 23, 1994

[54] SWITCHED CAPACITOR AMPLIFIER CIRCUIT OPERATING WITHOUT SERIALLY COUPLED AMPLIFIERS

[75] Inventors: Anthony Mellissinos, Encinitas; Scott Powell, Carlsbad, both of Calif.

[73] Assignee: Hughes Aircraft Company, Los Angeles, Calif.

[21] Appl. No.: 855,985

[22] Filed: Mar. 20, 1992

[51] Int. Cl.$^5$ .................. G06G 7/12; H03K 5/153; H03K 5/00; H03K 1/02
[52] U.S. Cl. .................. 307/490; 307/494; 307/353; 307/520; 307/364; 328/127; 328/151; 328/165; 328/167; 330/9
[58] Field of Search .............. 307/490, 494, 520, 353, 307/364; 328/151, 167, 127, 165; 330/9

[56] References Cited

U.S. PATENT DOCUMENTS

| | | | |
|---|---|---|---|
| 4,446,438 | 5/1984 | Chang et al. | 328/167 |
| 4,531,106 | 7/1985 | Ganesan | 330/9 |
| 4,714,843 | 12/1987 | Smith | 330/9 |
| 4,769,563 | 9/1988 | Holberg et al. | 328/167 |
| 4,769,612 | 9/1988 | Tamakoshi et al. | 328/167 |
| 4,806,874 | 2/1989 | Michel | 330/9 |
| 4,835,482 | 5/1989 | Tamakoshi et al. | 328/167 |
| 4,924,189 | 5/1990 | Senn et al. | 328/167 |
| 5,220,286 | 6/1993 | Nadeem | 330/9 |
| 5,281,860 | 1/1994 | Krenik et al. | 307/353 |

*Primary Examiner*—Timothy P. Callahan
*Assistant Examiner*—Troug Phan
*Attorney, Agent, or Firm*—W. C. Schubert; W. K. Denson-Low

[57] ABSTRACT

A switched capacitor circuit (10) is responsive to a two phase repetitive clock signal comprised of alternating periods ($\phi 1$) and ($\phi 2$). The circuit includes a first input branch including a first amplifier (A) for charging a first capacitance (C1) from a first input signal during period ($\phi 2$). The circuit further includes a second input branch that includes a second amplifier (B) for charging a second capacitance (CA) from a second input signal during a period ($\phi 1A$), and for charging a third capacitance (CB) from the second input signal during a period ($\phi 1B$); wherein ($\phi 1A$) and ($\phi 1B$) alternate in occurrence with one another during successive ($\phi 1$) periods. The circuit further includes switches for coupling the first capacitance and the second capacitance to an input of an output amplifier (C) during ($\phi 1B$), and for coupling the first capacitance and the third capacitance to the input of the output amplifier during ($\phi 1A$). The teaching of the invention provides for the interconnection of several switched capacitor branches without requiring that any two series connected amplifiers settle during the same clock phase.

3 Claims, 2 Drawing Sheets

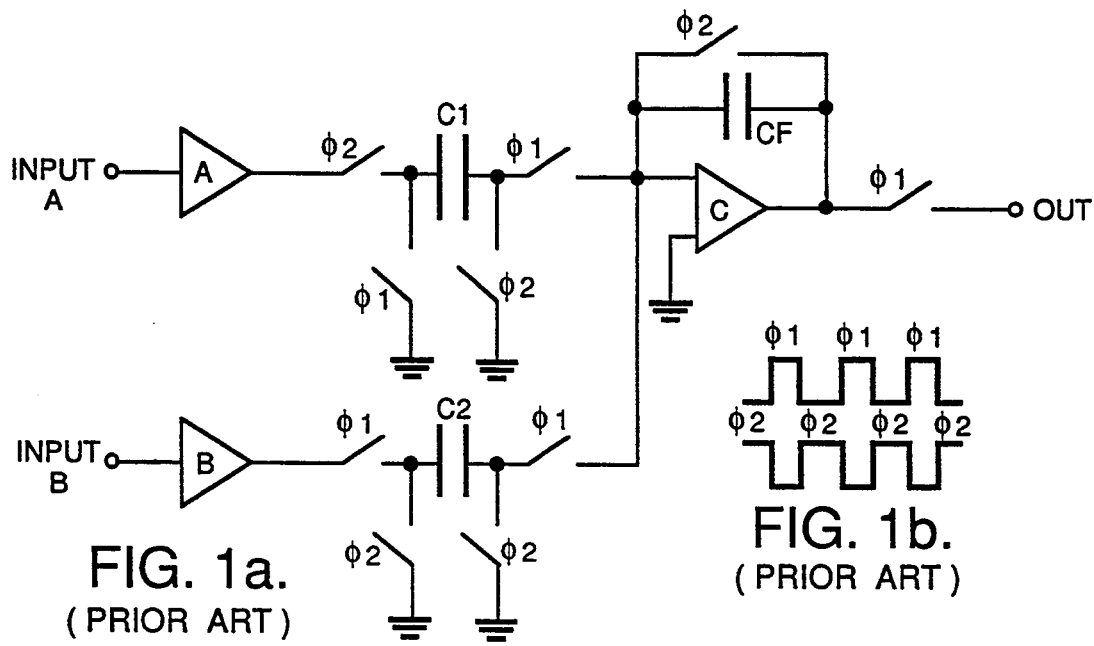
FIG. 1a. (PRIOR ART)
FIG. 1b. (PRIOR ART)
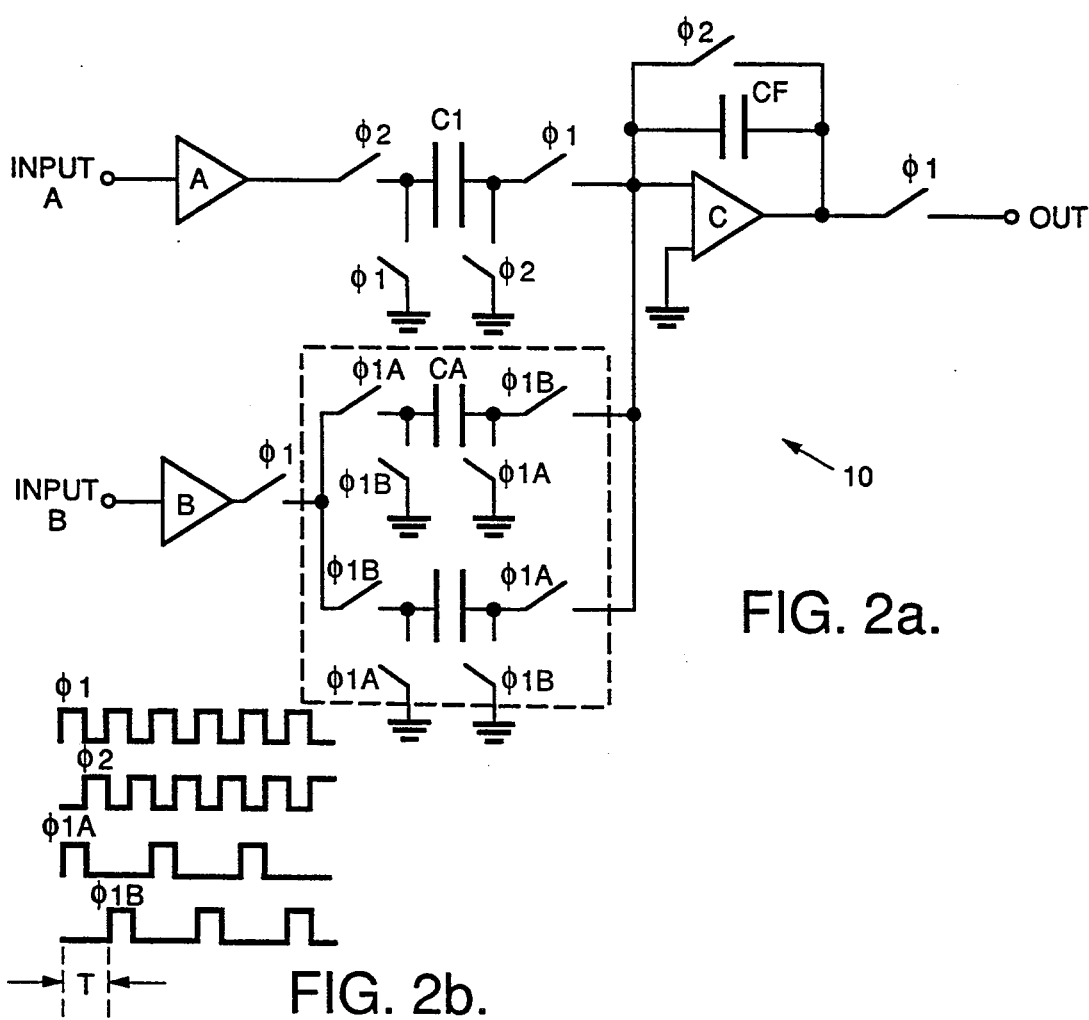
FIG. 2a.
FIG. 2b.

SWITCHED CAPACITOR AMPLIFIER CIRCUIT OPERATING WITHOUT SERIALLY COUPLED AMPLIFIERS

FIELD OF THE INVENTION

This invention relates generally to switched capacitor circuitry and, in particular, to a switched capacitor circuit that employs multiple capacitors per input signal.

BACKGROUND OF THE INVENTION

FIG. 1a represents a conventional switched capacitor circuit and FIG. 1b illustrates a timing diagram for same. In the timing diagram a two phase clock ($\phi1$ and $\phi2$) drives a plurality of switches within a first switched capacitor branch, containing C1, and within a second switched capacitor branch, containing C2. The switches are designated by their respective driving clock phase. As employed herein, all switches designated ($\phi1$) close when this phase is high and open when this phase is low. All switches designated ($\phi2$) close when this phase is high and open when this phase is low. In a typical embodiment each of the switches is an electronic device, such as a FET. One particularly useful application for the circuit of FIG. 1a is as a component of an analog-to-digital converter (A/D).

In operation, and beginning with ($\phi2$), amplifier A stores charge on C1, the output of amplifier B and the input of amplifier C are disconnected from the circuit, capacitor C2 is reset to a ground potential, and the integration capacitor CF is reset by the switch connected in parallel therewith. At ($\phi1$), C1 is connected to the summing junction of amplifier C, and the output of amplifier B is also coupled to the summing junction of amplifier C through C2. During ($\phi1$) both C1 and C2 discharge into the feedback capacitor CF and their respective outputs are summed.

A problem that arises during the use of this conventional circuit is that the output of amplifier (B) settles during $\phi1$ and, also during $\phi1$, the output of amplifier B drives amplifier C. That is, the output signals of both amplifiers B and C must settle for some finite amount of time during $\phi1$, although the settling of amplifier C cannot occur until after amplifier B has settled. The sequential settling requirement precludes the use of the circuit of FIG. 1 in an A/D that is required to operate at a high rate, such as 20 million conversions/sec, and at a high conversion accuracy, such as greater than 12 bit accuracy.

As considered herein, the term "settling" refers to the characteristic of an amplifier output signal to asymptotically approach a steady state value after a change in the input to the amplifier. Related to this definition is a definition of an amplifier "settling time", which refers to an amount of time required for the amplifier output signal to approach the steady state value, to within some desired tolerance, after a change in the input to the amplifier.

One conventional approach to overcoming this problem includes the use of half-clock cycle delay buffers to isolate amplifier B from amplifier C. Each buffer contains a high slew rate, high bandwidth, high power amplifier. However, the error resulting from the increased power, and complexity, make this approach undesirable.

It is therefore an object of the invention to provide a method, and circuitry for practicing the method, for coupling two input signals to an output node, without requiring the use of two serially coupled amplifiers or additional delay amplifiers.

SUMMARY OF THE INVENTION

The foregoing and other problems are overcome and the object of the invention is realized by a switched capacitor circuit that employs multiple capacitors, each of the multiple capacitors charging to an input voltage during a separate clock period. The use of the invention facilitates the interconnection of several switched capacitor branches without requiring that any two series connected amplifiers settle during the same clock phase.

Furthermore, the teaching of the invention allows the phase of signals in separate input branches to be matched by independently varying the clock delay of each branch.

More specifically, there is disclosed a circuit that is responsive to a two phase repetitive clock signal comprised of alternating periods ($\phi1$) and ($\phi2$). The circuit includes a first input branch including a first amplifier for charging a first capacitance from a first input signal during period ($\phi2$). The circuit further includes a second input branch that includes a second amplifier for charging a second capacitance from a second input signal during a period ($\phi1A$), and for charging a third capacitance from the second input signal during a period ($\phi1B$); wherein ($\phi1A$) and ($\phi1B$) alternate in occurrence with one another during successive ($\phi1$) periods. The circuit further includes switches for coupling the first capacitance and the second capacitance to an input of an output amplifier during ($\phi1B$), and for coupling the first capacitance and the third capacitance to the input of the output amplifier during ($\phi1A$).

BRIEF DESCRIPTION OF THE DRAWING

The above set forth and other features of the invention are made more apparent in the ensuing Detailed Description of the Invention when read in conjunction with the attached Drawing, wherein:

FIG. 1a is a simplified schematic diagram of a two branch switched capacitor amplifier circuit of the prior art;

FIG. 1b is a timing diagram illustrating the operation of the circuit of FIG. 1a;

FIG. 2a is a simplified schematic diagram of a two branch switched capacitor amplifier circuit constructed in accordance with the invention;

FIG. 2b is a timing diagram illustrating the operation of the circuit of FIG. 2a;

DETAILED DESCRIPTION OF THE INVENTION

Referring to FIG. 2a there is shown a switched capacitor amplifier circuit 10 that is constructed and operated in accordance with the invention. It should be noted that the construction of the first branch, comprised of amplifier A and capacitor C1, and the output stage, comprised of amplifier C and feedback capacitor CF, is the same as the circuit shown in FIG. 1a.

Referring specifically to the circuitry shown within the dashed box there is now described the operation of the circuit 10, in conjunction with the timing diagram of FIG. 2b. As before, the switches are designated by their respective driving clock phase. As employed herein, all switches designated ($\phi$1A) close when this phase is high and open when this phase is low. All switches designated ($\phi$1B) close when this phase is high and open when this phase is low.

As can be seen, capacitor C2 of FIG. 1a is replaced by two parallel connected capacitors CA and CB. CA and CB each have a capacitance value equal to the value of C2 so as to achieve the same performance on a per clock phase basis. A plurality of switches are coupled to each of the capacitors CA and CB in a manner similar to that of the switches coupled to C2 of FIG. 1a. To operate this switch configuration two additional timing pulses are provided. Specifically, timing signals ($\phi$1A) and ($\phi$1B) occur as shown in FIG. 2b so that ($\phi$1A) occurs on n, n+2, n+4, etc. ($\phi$1) clock pulses, and ($\phi$1B) occurs on the intervening n+1, n+3, n+5, etc. ($\phi$1) clock pulses. That is, ($\phi$1A) and ($\phi$1B) alternate in occurrence with one another during successive ($\phi$1) periods.

Figure 3A:
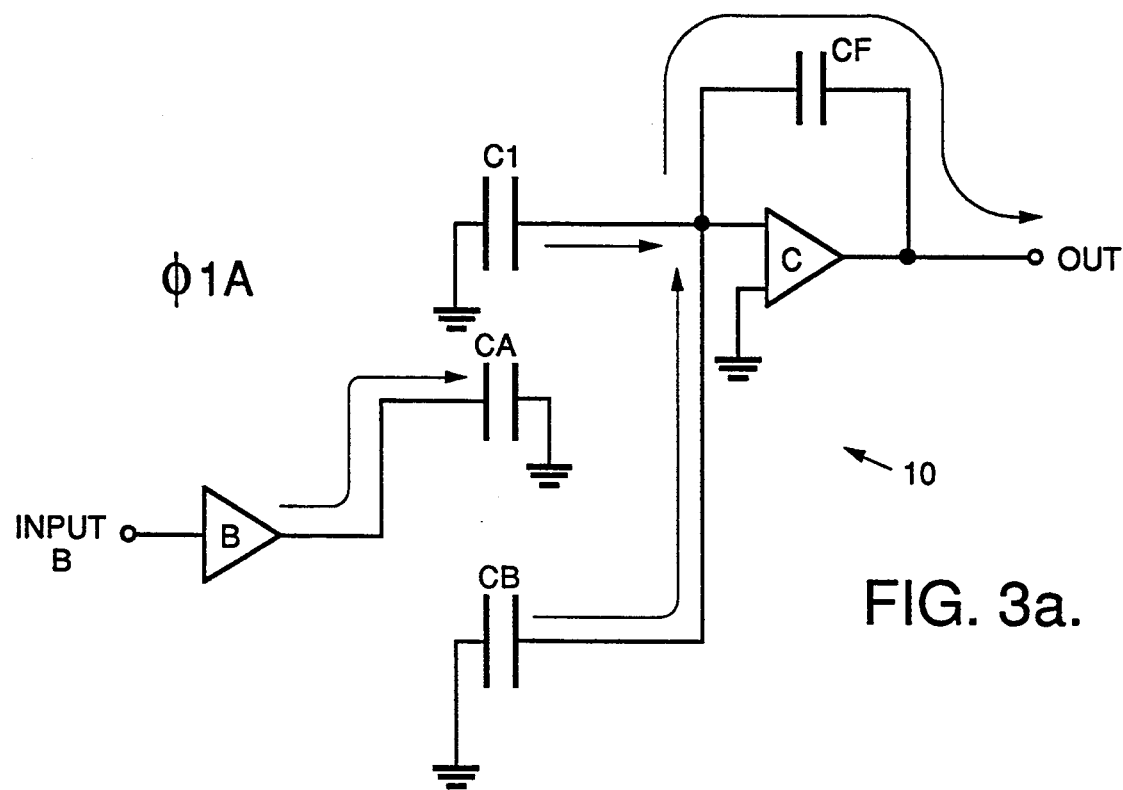
FIG. 3a illustrates the operation of the circuitry of FIG. 2a during the timing phase $\phi1A$.

In operation, and beginning with ($\phi$2), the output of amplifier A charges C1 while the feedback capacitor CF is reset by the switch connected in parallel therewith. At ($\phi$1) and ($\phi$1A) (FIG. 3a) C1 is connected to the input node of amplifier C and the output of amplifier B is connected to the capacitor CA and charges same. The input node of amplifier C is connected to capacitor CB which discharges, in conjunction with C1, into the feedback capacitor CF. CB was charged during a preceding ($\phi$1B) cycle. In that amplifier C is connected to an already charged capacitor, and not to the output of amplifier B, the settling time of amplifier C is decoupled from and is not incrementally added to the settling time of amplifier B. Thus, in that amplifier C is not required to wait for amplifier B to settle, the output of amplifier C becomes stable and usable within a significantly shorter period of time than does the output of amplifier C in the prior art circuit of FIG. 1.

After this ($\phi$1) and ($\phi$1A) period, ($\phi$2) again occurs; C1 is charged from amplifier A, as before, and CF is reset.

Figure 3B:
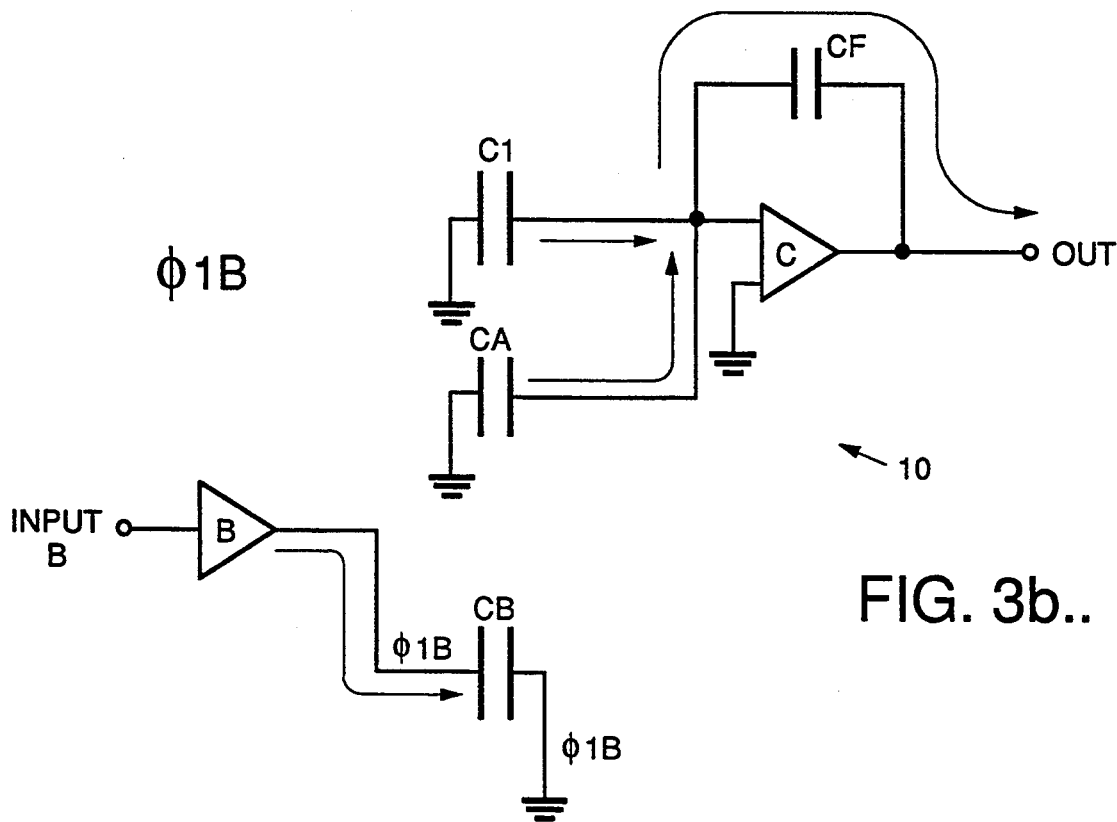
FIG. 3b illustrates the operation of the circuitry of FIG. 2a during the timing phase $\phi1B$.

At ($\phi$1) and ($\phi$1B) time (FIG. 3b) the output of amplifier B is connected to CB and charges same. Simultaneously, the previously charged capacitor CA is connected to the input node of amplifier C, along with C1, and both CA and C1 discharge into CF. As before, amplifier C is decoupled from the output of amplifier B and the settling time of amplifier C is independent of the settling time of amplifier B.

It can also be seen that clock pulses ($\phi$1A) and ($\phi$1B) operate to add a one clock period (T) delay to the output of amplifier B before this signal is summed with the output of amplifier A. This additional delay may be beneficial in some applications wherein it is desired to match the phase of input signals A and B. One particular application is in the construction of an inter-stage gain stage of a sigma-delta A/D converter.

For the illustrated embodiment the values of capacitors C1, CA, CB, and CF are on the order of one picofarad to approximately 30 picofarads. Preferably, all of the components shown in FIG. 2a are monolithically integrated upon a common substrate.

It should be realized that modifications may be made to the circuitry shown in FIG. 2a while still achieving substantially the same operation. For example, there may be multiple A branches operating with $\phi$1/$\phi$2 and multiple B branches (identically configured) operating on $\phi$1A/$\phi$1B. Thus, while the invention has been particularly shown and described with respect to a preferred embodiment thereof, it will be understood by those skilled in the art that changes in form and details may be made therein without departing from the scope and spirit of the invention.

What is claimed is:

1. An amplifier circuit responsive to a two-phase repetitive clock signal comprised of alternating periods ($\phi$1) and ($\phi$2), said amplifier circuit for combining two signals and comprising
    a first branch including a first amplifier having an output, and having a first capacitor switchably coupled to said output of said amplifier and switchably coupled to an output node of said first branch;
    an output amplifier having an input terminal coupled to said output node of said first branch;
    a first switching means in said first branch for coupling said first amplifier to said first capacitor during period ($\phi$2) and for coupling said first capacitor to said output node of said first branch during period ($\phi$1);
    a second branch including a second amplifier having an output, and having second and third capacitors alternately switchably coupled to said output of said second amplifier and alternately switchably coupled to an output node of said second branch, said input terminal of said output amplifier coupled to said output node of said second branch;
    second switching means in said second branch for coupling, during a period ($\phi$1A), said second amplifier to said second capacitor and said third capacitor to said output node of said second branch and for coupling, during a period ($\phi$1B), said second amplifier to said third capacitor and said second capacitor to said output node of said second branch, wherein ($\phi$1A) and ($\phi$1B) alternate in occurrence with one another during successive ($\phi$1) periods, whereby during each ($\phi$1) period the second amplifier is not coupled to the output amplifier.

2. A circuit as set forth in claim 1 wherein the output amplifier has an integration capacitor coupled between said input terminal of the output amplifier and an output terminal of the output amplifier.

3. A method of operating a circuit in response to a two phase repetitive clock signal comprised of alternating periods ($\phi$1) and ($\phi$2), comprising the steps of:
    charging a first capacitance from a first input signal during period ($\phi$2);
    charging a second capacitance from a second input signal during a period ($\phi$1A);
    charging a third capacitance from the second input signal during a period ($\phi$1B), wherein ($\phi$1A) and ($\phi$1B) alternate in occurrence with one another during successive ($\phi$1) periods;
    wherein the step of charging a third capacitance includes a step of coupling the first capacitance and the second capacitance to an output node during the period ($\phi$1B); and
    wherein the step of charging the second capacitance includes a step of coupling the first capacitance and the third capacitance to the output node during the period ($\phi$1A).

* * * * *